(12) United States Patent
Park

(10) Patent No.: US 6,987,049 B2
(45) Date of Patent: Jan. 17, 2006

(54) SEMICONDUCTOR TRANSISTORS AND METHODS OF FABRICATING THE SAME

(75) Inventor: Cheolsoo Park, Seoul (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 65 days.

(21) Appl. No.: 10/749,541

(22) Filed: Dec. 30, 2003

(65) Prior Publication Data

US 2005/0037583 A1    Feb. 17, 2005

(30) Foreign Application Priority Data

Dec. 30, 2002    (KR) .................... 10-2002-0086236

(51) Int. Cl.
*H01L 21/00*    (2006.01)

(52) U.S. Cl. ...................... 438/291; 438/305
(58) Field of Classification Search ........ 438/289–291, 438/305
See application file for complete search history.

(56) References Cited

U.S. PATENT DOCUMENTS

| 5,571,738 A | 11/1996 | Krivokapic ................. 437/44 |
| 6,583,017 B2 | 6/2003 | Hu et al. .................... 438/306 |
| 2001/0016392 A1* | 8/2001 | Ponomarev et al. ........ 438/291 |

* cited by examiner

*Primary Examiner*—Richard A. Booth
(74) *Attorney, Agent, or Firm*—Hanley, Flight & Zimmerman, LLC

(57) ABSTRACT

In an example method for fabricating a transistor in a semiconductor device, a buffer insulation layer and a first insulation layer are deposited and etched, and poly electrodes for an LDD are formed on sidewalls of thereof. After a local channel region is formed into a semiconductor substrate by an impurity ion implantation process, a trench-shaped gate insulation layer is deposited on the gate region. A gate electrode material is deposited into the trench-shaped region and planarized by a blanket etchback or a CMP process. After a silicide is formed by a salicidation process, a second insulation layer and a third insulation layer are formed thereon, sequentially. Contact holes for a gate electrode, a source electrode and a drain electrode may etched and a conductive material may be filled therein, thereby forming a gate plug, a source contact plug and a drain plug.

15 Claims, 3 Drawing Sheets

SEMICONDUCTOR TRANSISTORS AND METHODS OF FABRICATING THE SAME

TECHNICAL FIELD

The present disclosure relates to a transistors and, more particularly, to semiconductor transistors and methods of fabricating the same.

BACKGROUND

As semiconductor devices have become highly integrated, approaches have been developed for decreasing a size of a unit element by reducing a length of a gate electrode, a thickness of a gate insulation layer, and a width of an isolation layer. However, among scaling factors in a semiconductor device, controlling the length of the gate electrode is difficult and, therefore, is expensive to perform. In addition, a short channel effect is known as a characteristic that is difficult to be controlled in a transistor manufacturing process.

To resolve such problems, U.S. Pat. Nos. 6,583,017 and 5,571,738 disclose a method for forming a lightly doped drain (hereinafter referred to as "LDD") region by an ion implantation process.

However, an improved process is still required that is capable of easily controlling the length of the gate electrode and suppressing the short channel effect.

DETAILED DESCRIPTION

Figure 1:
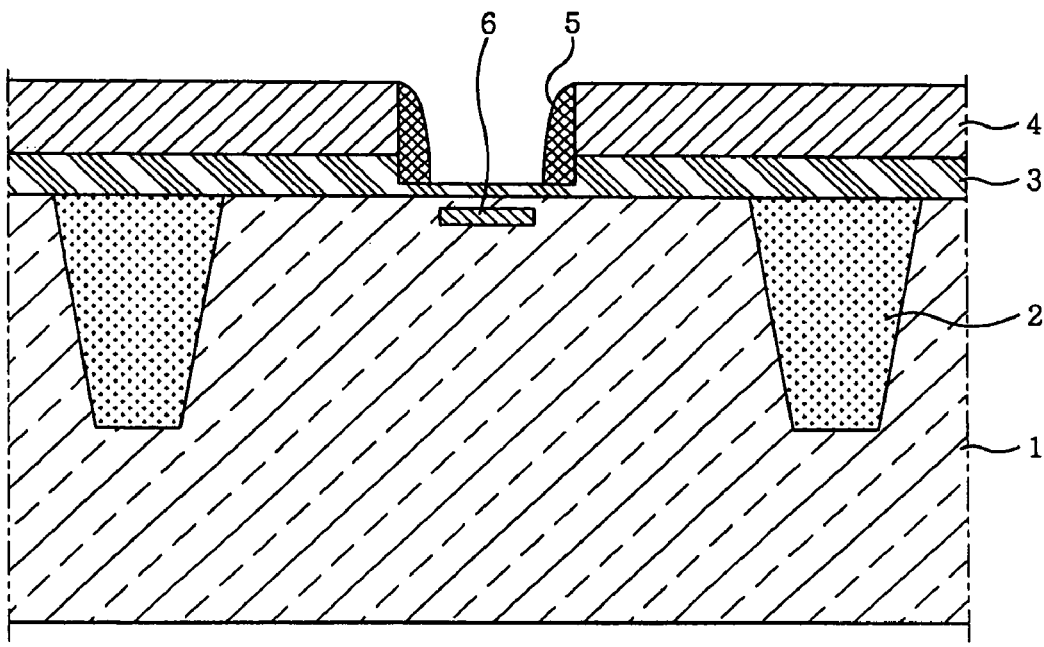
FIGS. 1 and 4 illustrate cross sectional views sequentially showing an example disclosed process of fabricating a transistor.

Referring to FIG. 1, after cleaning a semiconductor substrate 1 in which an active region is isolated from an inactive region by isolators 2, an oxide layer, which acts as a buffer insulation layer 3, is thermally grown and a nitride layer as a first insulation layer 4 is thickly deposited thereon.

A first photoresist pattern (not shown) for forming a gate region is formed on the first insulation layer 4 by a photolithography process. The first insulation layer 4 and the buffer insulation layer 3 may be sequentially etched by an anisotropic dry etching process using the first photoresist pattern as a mask. In the anisotropic dry etching process, the buffer insulation layer 3 is not entirely removed and remains with a small thickness. The first photoresist pattern is then removed. A polysilicon is deposited on sidewalls of the first insulation layer 4 and the buffer insulation layer 3 by using an in-situ doping process, thereby forming poly electrodes 5 for an LDD. As a result, the poly electrodes 5 are formed on an active region of a semiconductor substrate and separated in two parts facing each other, which defines a length of a gate electrode to be formed later.

Subsequently, a local channel region 6 is formed into the semiconductor substrate by performing a local ion implantation process under the buffer insulation layer, i.e., under the gate electrode 8 to be formed later. The local channel region 6 serves to prevent lateral diffusions of a source electrode 10 and a drain electrode 10b to be formed later, thereby suppressing the short channel effect.

Figure 2:
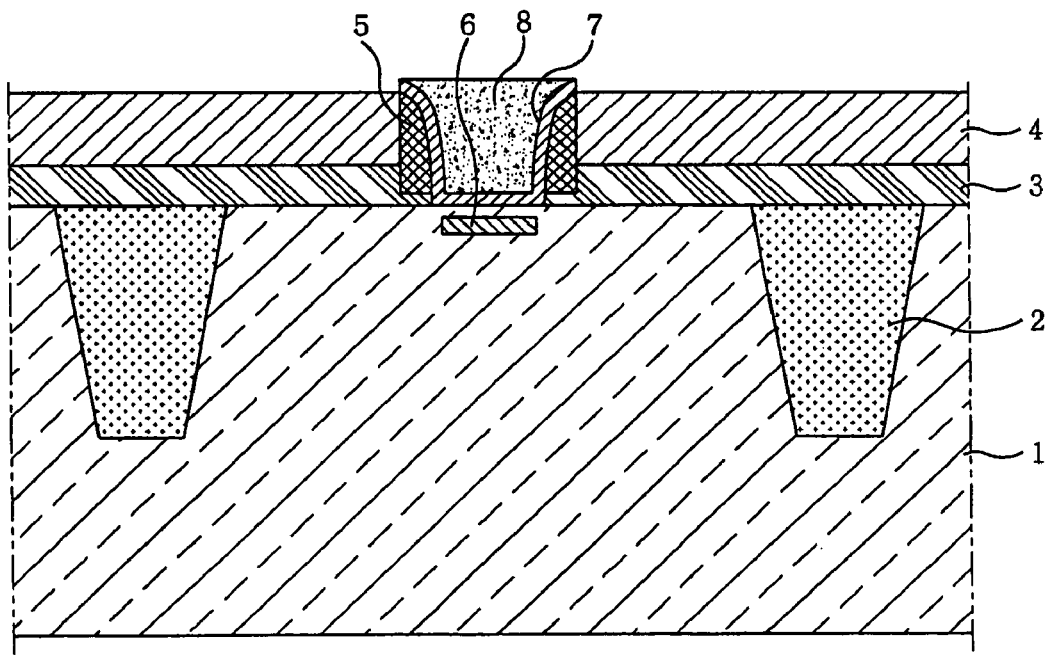

As shown in FIG. 2, after the buffer oxide layer 3 having a thickness of some tens of angstroms (Å) remaining in the gate region is removed by cleaning, a gate insulation layer 7 is deposited on the sidewalls of the poly electrode 5 and the exposed portion of the semiconductor substrate. A gate electrode material is deposited on the gate insulation layer 7 and a blanket etchback process or a chemical mechanical polishing (CMP) process is performed thereon, thereby forming the gate electrode 8. In other words, the gate insulation layer 7 is formed with a trench-shape on the sidewalls of the poly electrodes 5 and on the semiconductor substrate above the local channel region 6 and the gate electrode material is filled into the trench-shaped region formed by the gate insulation layer 7.

Figure 3:
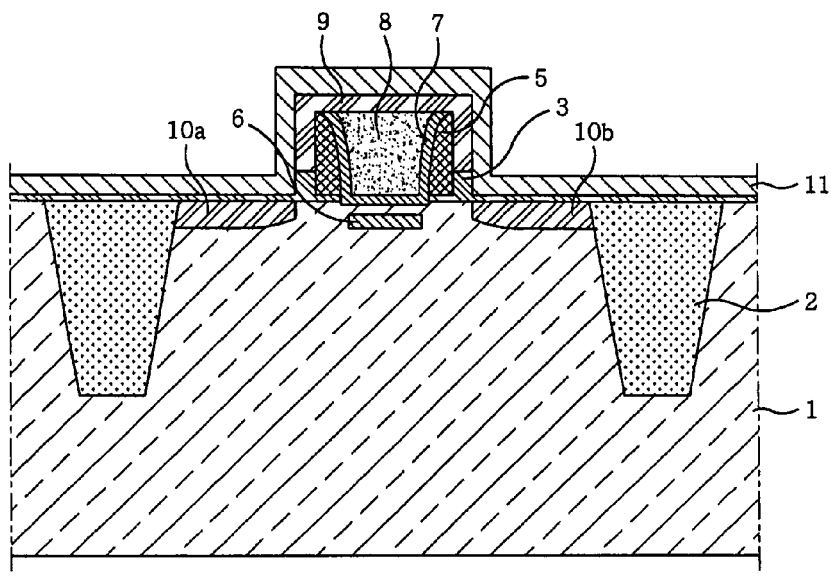

Referring to FIG. 3, the first insulation layer 4 and an upper part of the buffer insulation layer 3 are removed by performing the blanket etchback process. A silicide 9 is formed on the outside surfaces of the gate electrode 8 and the poly electrode 5 by performing a salicidation process. Subsequently, the source electrode 10a and the drain electrode 10b are formed by implantating high density impurity ions into the semiconductor substrate on the left and the right side of the gate electrode 8. A nitride layer having a thickness of some hundreds of Å as a second insulation layer 11 then is deposited on the resultant structure.

In case TiN/W is deposited as the gate electrode material, the silicide forming process may be omitted. Further, although according to one example the source electrode 10a and the drain electrode 10b are formed by the ion implantation process, in other examples they may be formed by a selective epitaxial silicon growth process or an in-situ doping process of polysilicon. Also, the source electrode 10a and the drain electrode 10b may be formed by annealing after deposition of boro-silicate glass (BSG) or phospho-silicate glass (PSG).

Figure 4:
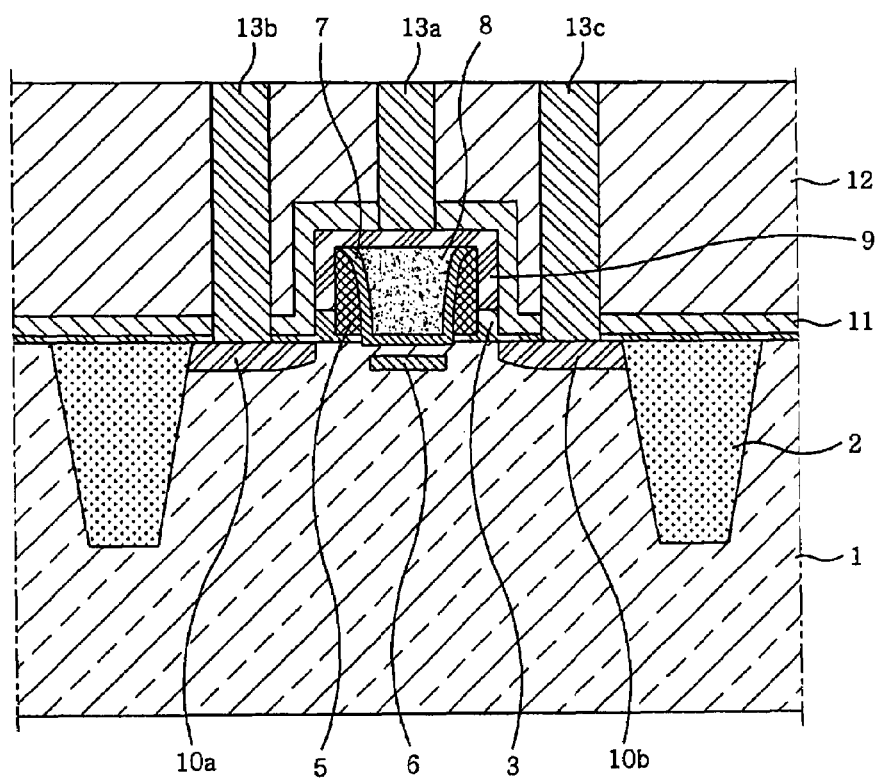

As shown in FIG. 4, a third insulation layer 12 is thickly deposited on the resultant structure and a second photoresist pattern (not shown) for forming a gate plug 13a, a source contact plug 13b and a drain contact plug 13c is formed thereon. Subsequently, contact holes through which the gate electrode 8, the source electrode 10a and the drain electrode 10b are exposed are formed by etching the third insulation layer 12, the second insulation layer 11 and the buffer insulation layer 3 using the second photoresist pattern as a mask. The second photoresist pattern is then removed. After depositing a conductive material on the entire surface of the resultant structure to fill the contact holes, the gate plug 13a, the source contact plug 13b, and the drain contact plug 13c are formed by planarizing the surface of the resultant structure using a CMP process or an entire etching process.

In accordance with the example processes disclosed herein, a transistor has poly electrodes for an LDD without performing an LDD ion implantation process, thereby controlling a length of a gate electrode at a low cost. Also, a local channel ion implantation process may be performed on the semiconductor substrate under the gate electrode, thereby easily suppressing a short channel effect.

As disclosed herein, one example method of fabricating a transistor may include sequentially depositing a buffer insulation layer and a first insulation layer on a semiconductor substrate, etching the first insulation layer and the buffer insulation layer and forming poly electrodes for a lightly doped drain (LDD) on sidewalls of the etched portion thereof, forming a local channel region into the semiconductor substrate under the poly electrodes by performing an local channel ion implantation process, and forming a gate insulation layer on surfaces of the poly electrodes and the semiconductor substrate above the local channel region. The example method may also include forming a gate electrode by depositing a gate electrode material on the gate insulation layer and forming a source and drain region.

Additionally, as disclosed herein, an example transistor may include poly electrodes for a lightly doped drain (LDD) formed on sidewalls of a gate region, a local channel region formed into a semiconductor substrate under the poly electrodes, a gate insulation layer formed with a trench-shape on sidewalls of the poly electrodes and on the semiconductor substrate above the local channel region, and a gate electrode filled into the trench-shaped region formed by the gate insulation layer. The example transistor may also include a source electrode and a drain electrode formed into the semiconductor substrate on the opposite sides of the gate electrode and a gate plug.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for fabricating a transistor in a semiconductor device, the method comprising:
    (a) sequentially depositing a buffer insulation layer and a first insulation layer on a semiconductor substrate;
    (b) etching the first insulation layer and the buffer insulation layer and forming poly electrodes for a lightly doped drain (LDD) on sidewalls of the etched portion thereof;
    (c) forming a local channel region into the semiconductor substrate under the poly electrodes by performing an local channel ion implantation process;
    (d) forming a gate insulation layer on surfaces of the poly electrodes and the semiconductor substrate above the local channel region;
    (e) forming a gate electrode by depositing a gate electrode material on the gate insulation layer; and
    (f) forming a source and drain region.

2. A method as defined by claim 1, further comprising forming a gate plug, a source contact plug, and a drain contact plug.

3. A method as defined by claim 2, further comprising:
    forming contact holes through which the gate electrode, the source electrode and the drain electrode are exposed by etching the third insulation layer, the second insulation layer and the buffer insulation layer; and
    forming plugs by sequentially depositing and planarizing a conductive material on the resultant structure.

4. A method as defined by claim 1, wherein, in (b), the buffer insulation layer is not entirely removed and, in (d), the gate insulation layer is formed after removing the buffer insulation layer remaining on the semiconductor substrate.

5. A method as defined by claim 1, wherein a length of the gate electrode is controlled by the poly electrodes.

6. A method as defined by claim 1, wherein, in (b), a polysilicon is deposited on sidewalls of the first insulation layer by an in-situ doping process to form the poly electrodes.

7. A method as defined by claim 1, wherein lateral diffusions of the source electrode and the drain electrode are prevented by the local channel region.

8. A method as defined by claim 1, wherein, in (e), the gate electrode is formed by performing a blanket etchback process after the gate electrode material is deposited on the gate insulation layer.

9. A method as defined by claim 1, wherein, in (e), the gate electrode is formed by performing a planarizing process after the gate electrode material is deposited on the gate insulation layer.

10. A method as defined by claim 9, wherein the planarizing process is a CMP (Chemical Mechanical Polishing) process.

11. A method as defined by claim 1, wherein, in (f), a silicide is formed on outside surfaces of the gate electrode and the poly electrode by performing a salicidation process before the source electrode and the drain electrode are formed into the semiconductor substrate.

12. A method as defined by claim 1, wherein, in (f), the source electrode and the drain electrode are formed by performing an impurity ion implantation process.

13. A method as defined by claim 1, wherein, in (f), the source electrode and the drain electrode are formed by performing a selective epitaxial silicon growth.

14. A method as defined by claim 1, wherein, in (f), the source electrode and the drain electrode are formed by performing an in-situ doping process of polysilicon.

15. A method as defined by claim 1, wherein, in (f), the source electrode and the drain electrode are formed by performing an annealing process after depositing borosilicate glass (BSG) or phospho-silicate glass (PSG).

* * * * *